US010923471B2

(12) United States Patent
Cheng et al.

(10) Patent No.: US 10,923,471 B2
(45) Date of Patent: *Feb. 16, 2021

(54) MINIMIZING SHORTING BETWEEN FINFET EPITAXIAL REGIONS (71) Applicant: TESSERA, INC., San Jose, CA (US)

(72) Inventors: Kangguo Cheng, Schenectady, NY (US); Balasubramanian Pranatharthiharan, Watervliet, NY (US); Alexander Reznicek, Troy, NY (US); Charan V. Surisetty, Clifton Park, NY (US)

(73) Assignee: Tessera, Inc., San Jose, CA (US)

( * ) Notice: Subject to any disclaimer, the term of this patent is extended or adjusted under 35 U.S.C. 154(b) by 60 days.

This patent is subject to a terminal disclaimer.

(21) Appl. No.: 16/296,433

(22) Filed: Mar. 8, 2019

(65) Prior Publication Data

US 2019/0206865 A1 Jul. 4, 2019

Related U.S. Application Data (60) Continuation of application No. 15/923,097, filed on Mar. 16, 2018, now Pat. No. 10,276,569, which is a
(Continued)

(51) Int. Cl.
*H01L 27/088* (2006.01)
*H01L 29/66* (2006.01)
(Continued)

(52) U.S. Cl.
CPC .... *H01L 27/0886* (2013.01); *H01L 21/28035* (2013.01); *H01L 21/28079* (2013.01);
(Continued)

(58) Field of Classification Search
CPC .......... H01L 27/0886; H01L 21/28035; H01L 21/28079; H01L 21/28088;
(Continued)

(56) References Cited

U.S. PATENT DOCUMENTS 7,037,774 B1 5/2006 Syau
7,087,471 B2 8/2006 Beintner
(Continued)

OTHER PUBLICATIONS

Auth, "22-nm Fully-Depleted Tri-Gate CMOS Transistors," IEEE Custom Integrated Circuits Conference (CICC), Sep. 9-12, 2012, 6 Pages.
(Continued)

*Primary Examiner* — Allen L Parker
*Assistant Examiner* — Charles N Ausar-El
(74) *Attorney, Agent, or Firm* — Lee & Hayes, P.C.

(57) ABSTRACT

The present invention relates generally to semiconductors, and more particularly, to a structure and method of minimizing shorting between epitaxial regions in small pitch fin field effect transistors (FinFETs). In an embodiment, a dielectric region may be formed in a middle portion of a gate structure. The gate structure be formed using a gate replacement process, and may cover a middle portion of a first fin group, a middle portion of a second fin group and an intermediate region of the substrate between the first fin group and the second fin group. The dielectric region may be surrounded by the gate structure in the intermediate region. The gate structure and the dielectric region may physically separate epitaxial regions formed on the first fin group and the second fin group from one another.

20 Claims, 9 Drawing Sheets

Related U.S. Application Data continuation of application No. 15/494,586, filed on Apr. 24, 2017, now Pat. No. 9,985,024, which is a continuation of application No. 15/203,847, filed on Jul. 7, 2016, now Pat. No. 9,704,753, which is a division of application No. 14/680,099, filed on Apr. 7, 2015, now Pat. No. 9,443,853.

(51) Int. Cl.

| | | |
|---|---|---|
| *H01L 21/28* | (2006.01) | |
| *H01L 21/8234* | (2006.01) | |
| *H01L 29/49* | (2006.01) | |
| *H01L 27/092* | (2006.01) | |
| *H01L 21/8238* | (2006.01) | |
| *H01L 27/108* | (2006.01) | |
| *H01L 21/84* | (2006.01) | |
| *H01L 29/78* | (2006.01) | |
| *H01L 29/06* | (2006.01) | |
| *H01L 29/08* | (2006.01) | |
| *H01L 29/423* | (2006.01) | |
| *H01L 27/12* | (2006.01) | |
| *H01L 29/417* | (2006.01) | |

(52) U.S. Cl.
CPC ............ *H01L 21/28088* (2013.01); *H01L 21/823418* (2013.01); *H01L 21/823431* (2013.01); *H01L 21/823437* (2013.01); *H01L 21/823481* (2013.01); *H01L 21/823821* (2013.01); *H01L 21/845* (2013.01); *H01L 27/0924* (2013.01); *H01L 27/10826* (2013.01); *H01L 27/10829* (2013.01); *H01L 27/10879* (2013.01); *H01L 27/1211* (2013.01); *H01L 29/0649* (2013.01); *H01L 29/0653* (2013.01); *H01L 29/0847* (2013.01); *H01L 29/41791* (2013.01); *H01L 29/42376* (2013.01); *H01L 29/495* (2013.01); *H01L 29/4916* (2013.01); *H01L 29/4966* (2013.01); *H01L 29/66545* (2013.01); *H01L 29/66795* (2013.01); *H01L 29/785* (2013.01); *H01L 29/7851* (2013.01); *H01L 29/7855* (2013.01)

(58) Field of Classification Search
CPC ..... H01L 21/823418; H01L 21/823431; H01L 21/823821; H01L 21/845; H01L 27/0924; H01L 27/10826; H01L 27/10829; H01L 27/10879; H01L 27/1211; H01L 29/0649; H01L 29/0653; H01L 29/0847; H01L 29/41791; H01L 29/4916; H01L 29/42376; H01L 29/495; H01L 29/4966; H01L 29/66545; H01L 29/66795; H01L 29/785; H01L 29/7851; H01L 29/7855
See application file for complete search history.

(56) References Cited

U.S. PATENT DOCUMENTS

| | | |
|---|---|---|
| 7,554,165 B2 | 6/2009 | Hokazono |
| 8,436,404 B2 | 5/2013 | Bohr et al. |
| 8,679,968 B2 | 3/2014 | Xie et al. |
| 8,716,124 B2 | 5/2014 | Schultz |
| 8,728,927 B1 | 5/2014 | Cheng et al. |
| 9,059,164 B2 | 6/2015 | Cheng et al. |
| 9,064,725 B2 | 6/2015 | Chen et al. |
| 9,070,719 B2 * | 6/2015 | Zhong ............ H01L 21/823878 |
| 9,070,770 B2 | 6/2015 | Basu et al. |
| 9,190,519 B2 | 11/2015 | Lin et al. |
| 9,219,153 B2 | 12/2015 | Xie et al. |
| 9,293,459 B1 | 3/2016 | Cheng et al. |
| 9,337,313 B2 | 5/2016 | Leobandung |
| 9,418,994 B1 | 8/2016 | Chao et al. |
| 9,443,853 B1 * | 9/2016 | Cheng ................. H01L 27/0924 |
| 9,508,825 B1 | 11/2016 | Basker et al. |
| 9,564,367 B2 | 2/2017 | Jacob et al. |
| 9,704,753 B2 | 7/2017 | Cheng et al. |
| 9,722,043 B2 | 8/2017 | Basker et al. |
| 9,852,951 B2 | 12/2017 | Cheng et al. |
| 9,985,024 B2 | 5/2018 | Cheng et al. |
| 2006/0177979 A1 | 8/2006 | Tu |
| 2010/0320503 A1 | 12/2010 | Chong et al. |
| 2010/0320509 A1 | 12/2010 | Knorr et al. |
| 2012/0193712 A1 | 8/2012 | Bryant et al. |
| 2012/0223394 A1 | 9/2012 | Toh et al. |
| 2013/0320412 A1 | 12/2013 | Yamasaki |
| 2014/0124840 A1 * | 5/2014 | Khakifirooz ...... H01L 29/66545 257/288 |
| 2014/0191296 A1 * | 7/2014 | Bergendahl ......... H01L 29/7855 257/288 |
| 2014/0217517 A1 | 8/2014 | Cai et al. |
| 2014/0264603 A1 | 9/2014 | He et al. |
| 2014/0312397 A1 | 10/2014 | Cheng et al. |
| 2014/0339629 A1 | 11/2014 | Xie et al. |
| 2015/0084134 A1 | 3/2015 | Lin et al. |
| 2015/0129988 A1 | 5/2015 | Leobandung |
| 2015/0162445 A1 | 6/2015 | Wu et al. |
| 2015/0200280 A1 | 7/2015 | Masuoka et al. |
| 2015/0200291 A1 | 7/2015 | Alptekin et al. |
| 2015/0206955 A1 | 7/2015 | Kim et al. |
| 2015/0318398 A1 * | 11/2015 | Xie ......................... H01L 29/78 257/288 |
| 2015/0325483 A1 | 11/2015 | Tran et al. |
| 2016/0141360 A1 | 5/2016 | Cheng et al. |
| 2016/0163826 A1 | 6/2016 | Cheng et al. |
| 2016/0172462 A1 | 6/2016 | Cheng et al. |
| 2017/0076954 A1 | 3/2017 | Seo et al. |
| 2018/0204837 A1 | 7/2018 | Cheng et al. |

OTHER PUBLICATIONS

Anonymous, "Method and Structure to Prevent epi merge related shorts between devices for finfet technology," An IP.com Prior Art Database Technical Disclosure, Mar. 25, 2014, p. 1-4, IP.com No. 000235784.

IBM: List of IBM Patents or Patent Applications Treated as Related (Appendix P), Mar. 26, 2019, 2 pages.

* cited by examiner

FIG. 9

MINIMIZING SHORTING BETWEEN FINFET EPITAXIAL REGIONS

BACKGROUND

The present invention relates generally to semiconductors, and more particularly, to a structure and method of minimizing shorting between epitaxial regions in small pitch fin field effect transistors (FinFETs).

With recent advancement in semiconductor device manufacturing, and in particular with regard to FinFETs, epitaxially formed source/drain regions are increasingly becoming preferred to provide low resistance contacts to the FinFETs and other devices. Typically, a FinFET device will include one or more fins having a source epitaxy formed thereon separated, by a gate structure, from one or more fins having a drain epitaxy thereon. The gate structure of one FinFET device is typically separated from the gate structure of an adjacent FinFET device by a portion of an underlying substrate. However, as device size continues to shrink, problems may arise with shorting between small pitch structures.

SUMMARY

According to an embodiment, a method of physically separating epitaxial regions in fin field effect transistors (FinFETs) is disclosed. The method may include: forming a dielectric region in a middle portion of a gate structure, wherein the gate structure is formed over a middle portion of a first fin group and a middle portion of a second fin group, and wherein the dielectric region is located in an intermediate region between the first set of fins and the second set of fins.

According to another embodiment, a method is disclosed. The method may include: forming a first fin group on a substrate; forming a second fin group on the substrate, the first fin group and the second fin group separated by an intermediate region of the substrate; forming a dummy gate layer on the first fin group, the second fin group, and the intermediate region; forming an opening in the dummy gate layer, the opening exposing an upper surface of the substrate in the intermediate region; forming a dielectric region in the opening; removing a portion of the dummy gate layer to form a dummy gate, wherein the dummy gate covers a middle portion of the first fin group and a middle portion of the second fin group; forming a spacer on an outer surface of the dummy gate; removing the dummy gate selective to the dielectric region; forming a gate on the first fin group, the intermediate region, and the second fin group, the gate surrounding the dielectric region and located within the spacer; forming one or more first epitaxial regions on the first fin group, the one or more first epitaxial regions separated from each other by the spacer, the gate, and the dielectric region; and forming one or more second epitaxial regions on the second fin group, the one or more second epitaxial regions separated from each other by the spacer, the gate, and the dielectric region, wherein the one or more first epitaxial regions are separated from the one or more second epitaxial regions by the spacer, the gate, the dielectric region, and a portion of the substrate in the intermediate region.

According to another embodiment, a structure is disclosed. The structure may include: a first fin group on a substrate; a second fin group on the substrate, the first fin group separated from the second fin group by an intermediate region of the substrate; a gate structure on a middle portion of the first fin group, a middle portion of the intermediate region, and a middle portion of the second fin group; a dielectric region in a middle portion of the gate structure, the dielectric region located in the intermediate region; one or more first epitaxial regions on the first fin group, the one or more first epitaxial regions separated from each other by the gate structure and the dielectric region; and one or more second epitaxial regions on the second fin group, the one or more second epitaxial regions separated from each other by the gate structure and the dielectric region, wherein the one or more first epitaxial regions are separated from the one or more second epitaxial regions by the gate structure, the dielectric region, and a portion of the substrate in the intermediate region.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The terms "epitaxial growth and/or deposition" and "epitaxially formed and/or grown" are used throughout the present application to denote the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. The temperature for epitaxial deposition typically ranges from 550° C. to 900° C. Although higher temperature typically results in faster deposition, the faster deposition may result in crystal defects and film cracking.

The present invention relates generally to semiconductors, and more particularly, to a structure and method of minimizing shorting between epitaxially regions in small pitch fin field effect transistors (FinFETs). As device size continues to scale down, especially below the 7 nm node, the close proximity of device structures may lead to problems caused by epitaxial overgrowth. In particular, in a device having multiple fins with a source epitaxy on one side of a gate structure and multiple fins with a drain epitaxy on the other side of the gate structure, shorting may occur if one or both of the source epitaxy and the drain epitaxy are overgrown.

In one scenario, excessive epitaxial growth on an outer portion of one side of a last fin may grow around the gate structure and encroach on epitaxial material grown on the other side of the gate structure. As the two different epitaxial regions encroach on one another around the gate structure, shorting may occur. In another scenario, excessive epitaxial growth from the last fin of one device may encroach on the epitaxial material of the last fin of an adjacent device, particularly when the devices are in close proximity to each other due to small pitches and tight ground rules. This encroachment may lead to the merging of epitaxial regions of two independent FinFETs, which may destroy the devices/circuit. Therefore, it may be desirable to form small pitch FinFET devices, especially those adjacent to one another, in such a way to minimize this epitaxial overgrowth and shorting. Embodiments by which a dielectric region may be formed in between adjacent gate structures to insulate the source epitaxy from the drain epitaxy are described below with reference to FIGS. 1A-9.

Figure 1A:
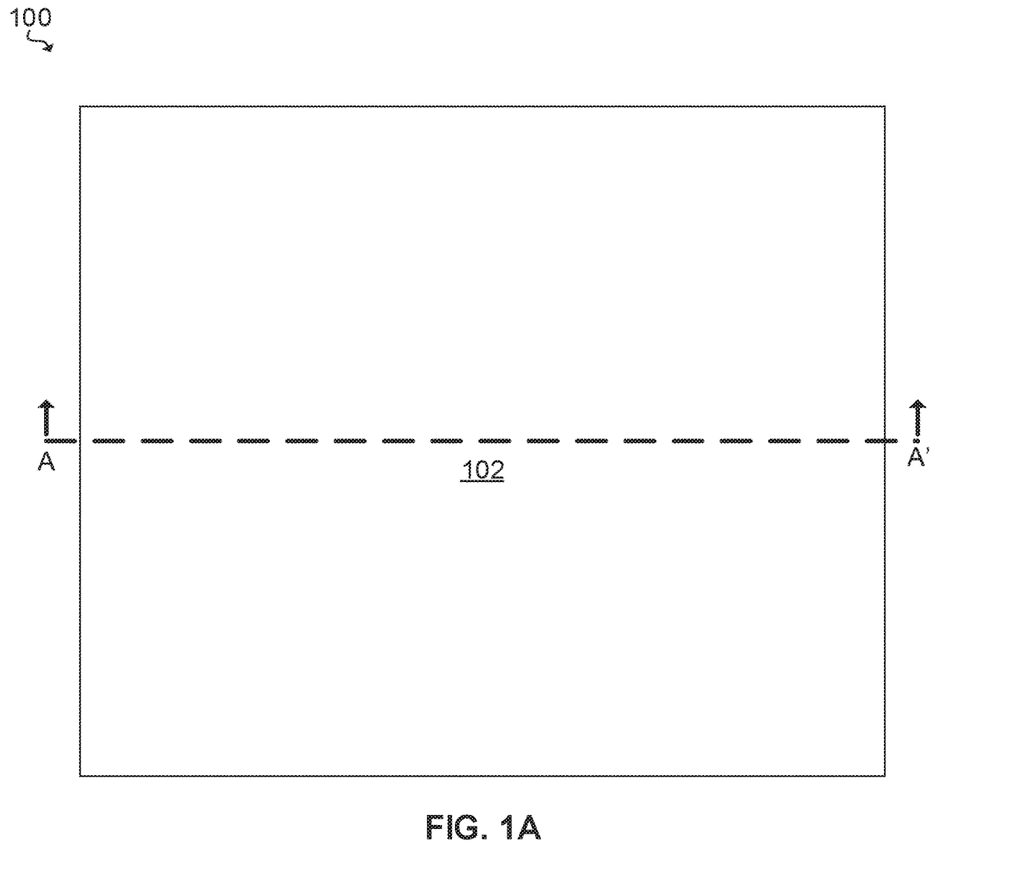
FIG. 1A is a top view and FIG. 1B is a cross section view, both illustrating a preliminary structure including a substrate, according an embodiment of the present invention.
Figure 1B:
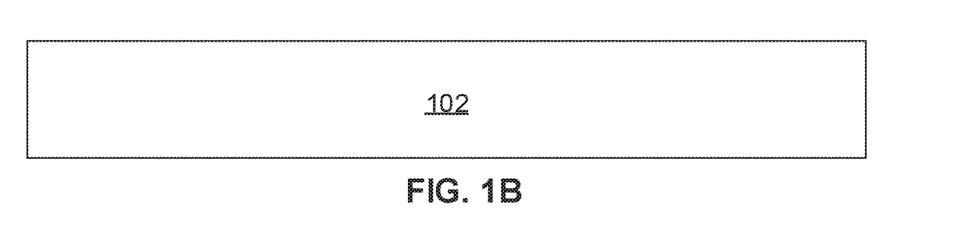

Referring now to FIG. 1A and FIG. 1B, a top view and a cross section view along section line A-A', respectively, illustrating a preliminary structure 100 are shown. In an embodiment, the structure 100 may include a substrate 102. The substrate 102 may be composed of any semiconductor material including, but not limited to: Si, Ge, SiGe, SiC, SiGeC, GaAs, InAs, InP and all other III/V or II/VI compound semiconductors. The substrate 102 may also be a layered semiconductor such as Si/SiGe, a silicon-on-insulator (SOI), or a SiGe-on-insulator (SGOI). The substrate 102 may be doped, undoped or contain both doped and undoped regions therein.

Figure 2A:
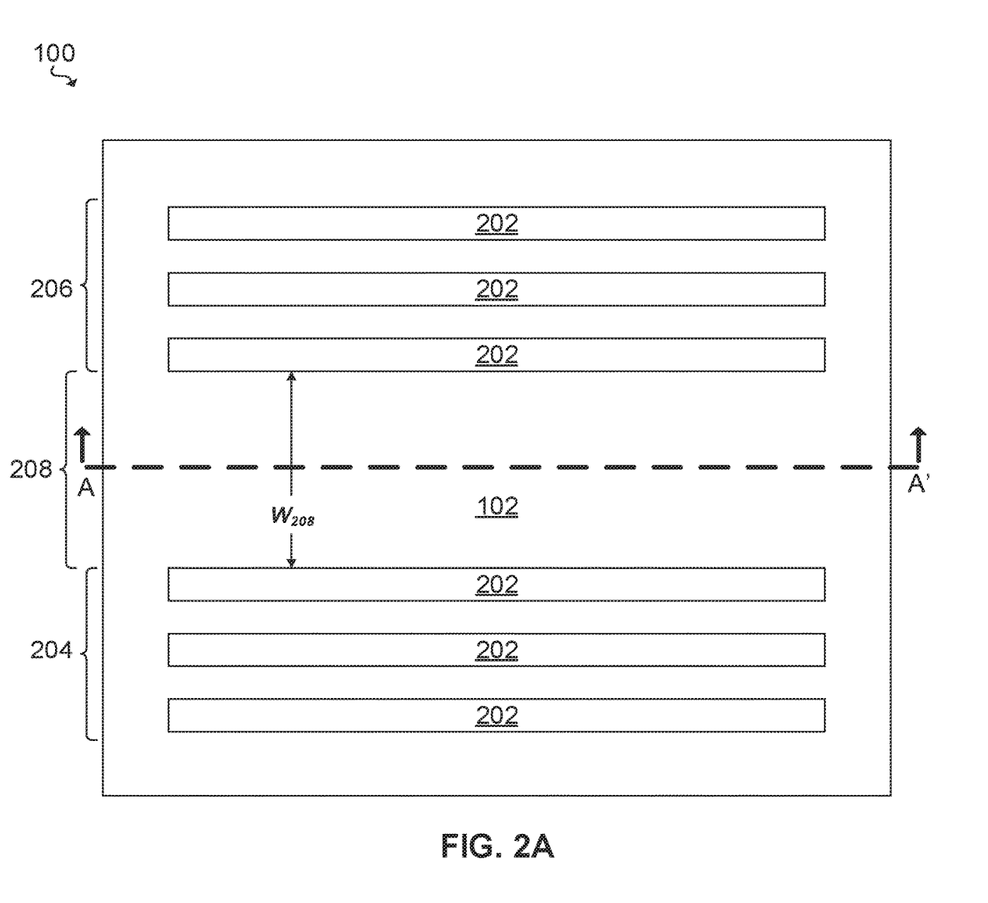
FIG. 2A is a top view and FIG. 2B is a cross section view, both illustrating forming one or more fins on the substrate, according an embodiment of the present invention.
Figure 2B:
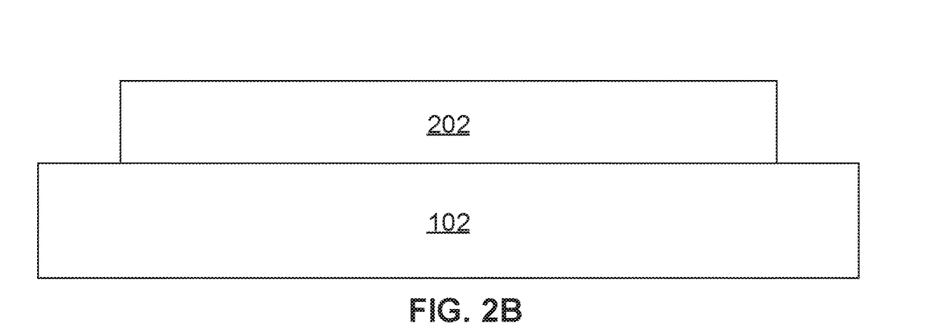

Referring now to FIG. 2A and FIG. 2B a top view and a cross section view along section line A-A', respectively, illustrating forming one or more fins 202 (hereinafter "fins") on the substrate 102 is shown. The fins 202 may have a width ranging from approximately 4 nm to approximately 40 nm. The fins 202 may have a height ranging from approximately 5 nm to approximately 300 nm. The fins 202 may be separated from one another by a distance ranging from approximately 4 nm to approximately 100 nm. The fins 202 may be formed, for example, by removing material from the substrate 102 using a photolithography process followed by an anisotropic etching process such as reactive ion etching (RIE) or plasma etching. Other methods of forming fins known in the art may also be utilized, such as sidewall image transfer (SIT).

In an embodiment in which the substrate 102 is a bulk substrate, the material of the fins 202 may be the same as the substrate 102 and there may be no identifiable boundary between the fins 202 and the substrate 102. Alternatively, the material of the fins 202 may be different from the substrate 102. For example, the fins 202 may be made of silicon germanium, and the substrate 102 may comprise silicon. In an embodiment in which the substrate 102 is a SOI substrate, the fins 202 may be formed from a top semiconductor layer (not shown) separated from a base layer (not shown) by a buried insulator layer (not shown). The top semiconductor layer and the base layer may be made of the same or different semiconductor material. The buried insulator layer may have a thickness ranging from approximately 10 to approximately 500 nm. The buried insulating layer may be composed of an insulating material, such as, for example, silicon oxide, silicon nitride, oxynitride, high-k dielectric material, low-k dielectric material, or a combination of insulating materials.

In an embodiment, the fins 202 may be separated into two groups, a first fin group 204 and a second fin group 206, which may be separated by a intermediate region 208. In an embodiment, the intermediate region 208 may have a width $W_{208}$ ranging from approximately 40 nm to approximately 400 nm. The first fin group 204 may correspond to a subsequently formed first FinFET device, and the second fin group 206 may correspond to a subsequently formed second FinFET device.

Figure 3A:
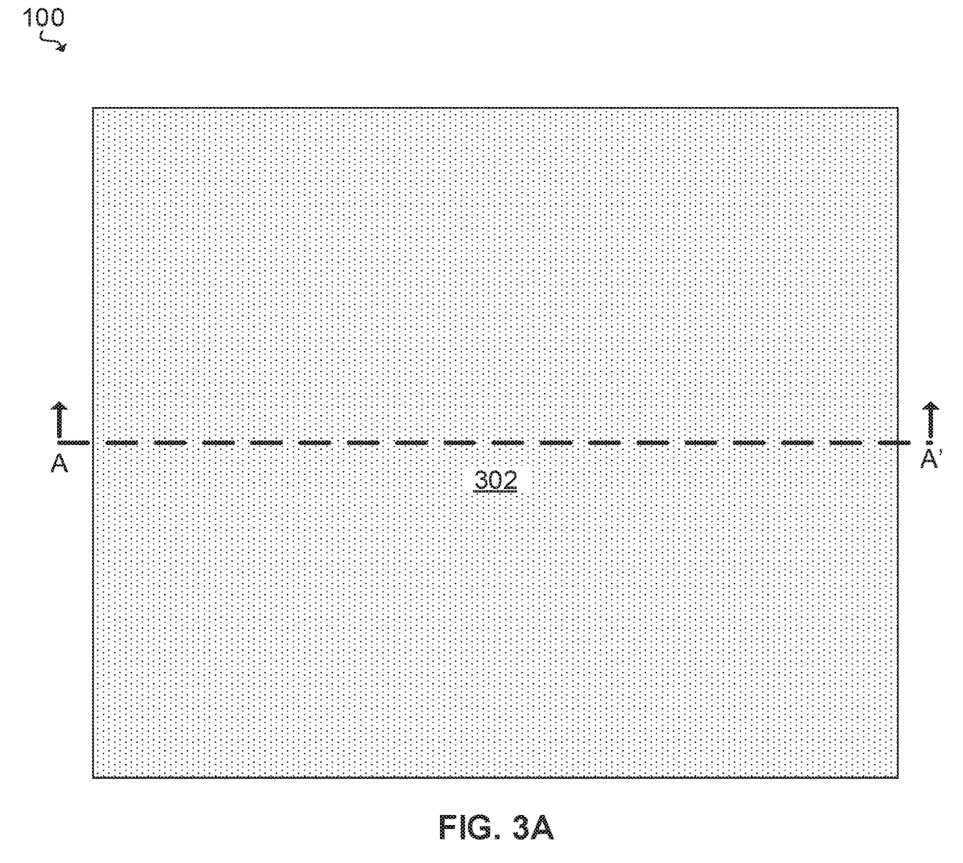
FIG. 3A is a top view and FIG. 3B is a cross section view, both illustrating forming a dummy gate layer on the substrate and the fins, according an embodiment of the present invention.
Figure 3B:
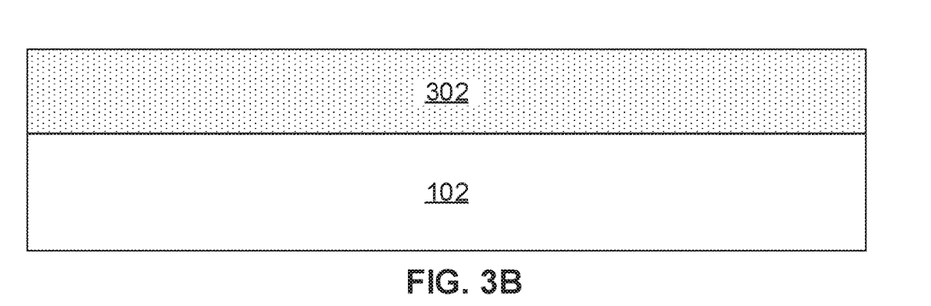

Referring now to FIG. 3A and FIG. 3B, a top view and a cross section view along section line A-A', respectively, illustrating forming a dummy gate layer 302 on the substrate 102 and the fins 202 is shown. In an embodiment, the dummy gate layer 302 may be composed of a conventional dummy gate material, such as, for example, a dielectric material, or polysilicon that may or may not be doped. The dummy gate layer 302 may be formed using a conventional deposition process, such as, for example, atomic layer deposition (ALD), chemical vapor deposition (CVD), low-pressure vapor deposition (LPCVD), plasma enhanced vapor deposition (PECVD), physical vapor deposition (PVD), molecular beam deposition (MBD), pulsed laser deposition (PLD), liquid source misted chemical deposition (LSMCD), plating, or sputtering. The dummy gate layer 302 may completely cover the fins 202. In an embodiment, the dummy gate layer 302 may be planarized using a conventional planarization process, such as chemical mechanical planarization (CMP), such that an upper surface of the dummy gate layer 302 is substantially flush with an upper surface of the fins 202.

Figure 4A:
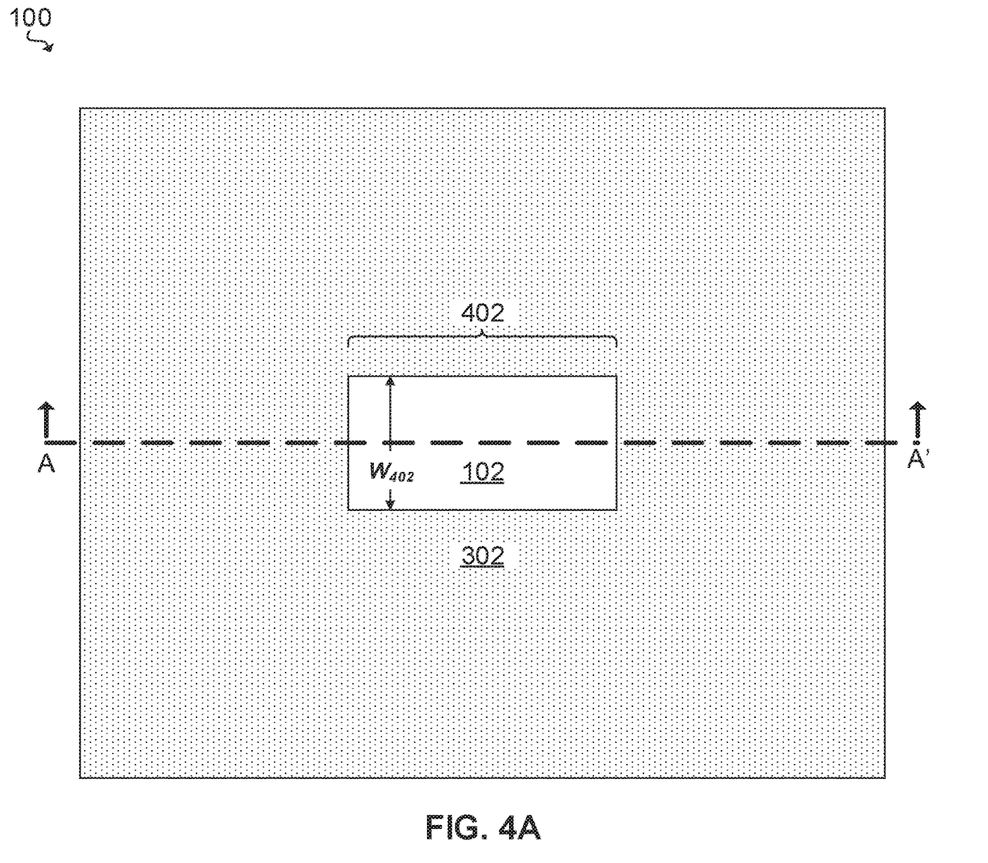
FIG. 4A is a top view and FIG. 4B is a cross section view, both illustrating forming an opening in the dummy gate layer, according an embodiment of the present invention.
Figure 4B:
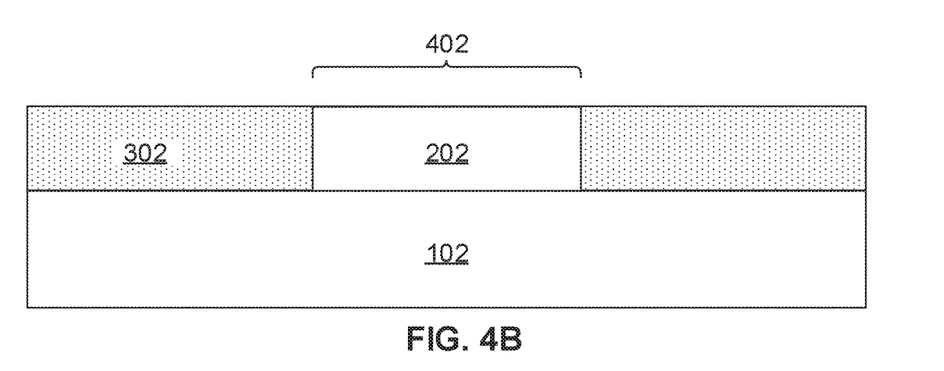

Referring now to FIG. 4A and FIG. 4B, a top view and a cross section view along section line A-A', respectively, illustrating forming an opening 402 in a middle portion of the dummy gate layer 302 is shown. The opening may be formed in the intermediate region 208 (FIG. 2A) between the first fin group 204 (FIG. 2A) and the second fin group 206 (FIG. 2A). The opening 402 may be formed by removing a portion of the dummy gate layer 302 using conventional patterning and etching techniques, such as, for example, reactive ion etching (RIE). The opening 402 may expose an upper surface of the substrate 102. In an embodiment, the opening may have a width $W_{402}$ that is less than the width $W_{208}$ of the intermediate region 208.

Figure 5A:
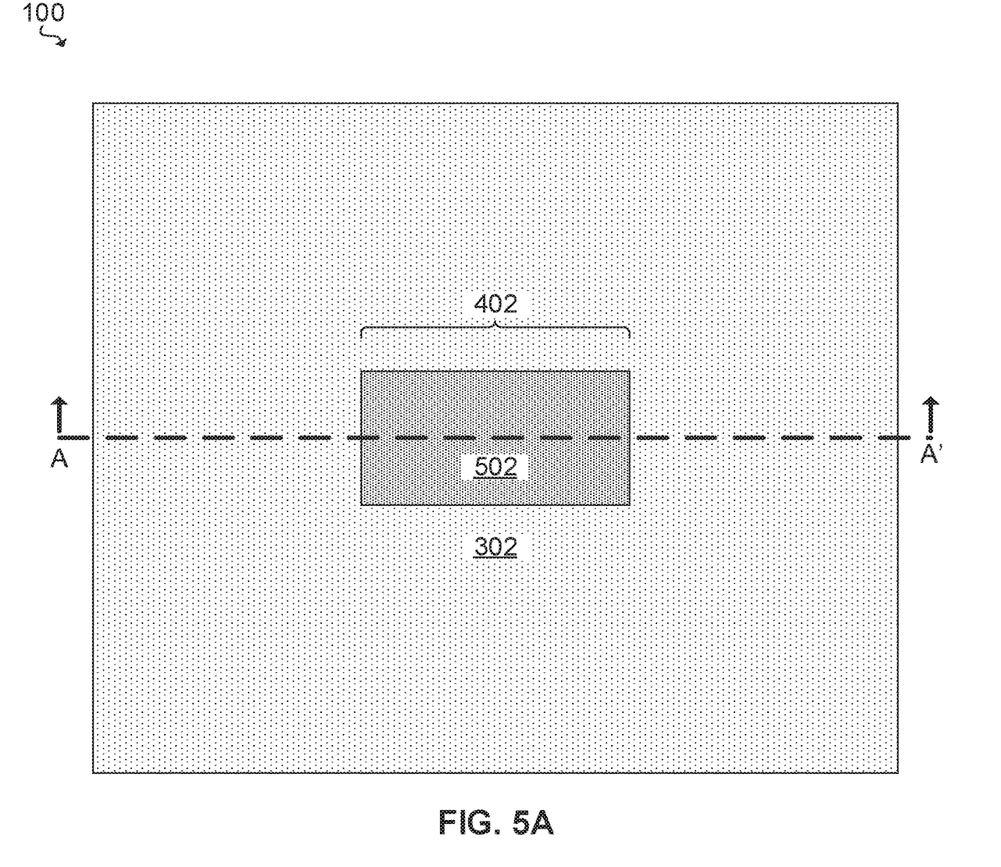
FIG. 5A is a top view and FIG. 5B is a cross section view, both illustrating forming a dielectric region in the opening, according an embodiment of the present invention.
Figure 5B:
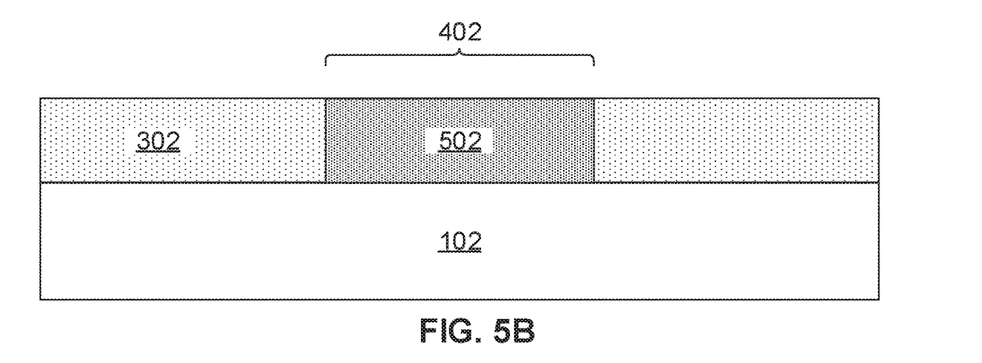

Referring now to FIG. 5A and FIG. 5B, a top view and a cross section view along section line A-A', respectively, illustrating forming a dielectric region 502 in the opening 402 (FIG. 4A) is shown. In an embodiment, the dielectric region 502 may be composed of a dielectric material, such as, for example, an oxide, a nitride, or an oxynitride. The dielectric region 502 may be formed using a conventional deposition process, such as, for example, ALD, CVD, LPCVD, PECVD, PVD, MBD, PLD, LSMCD, plating, or sputtering. In an embodiment, a conventional planarization process, such as, for example, CMP, may be performed such that an upper surface of the dielectric region 502 is substantially flush with the upper surface of the dummy gate layer 302.

Figure 6A:
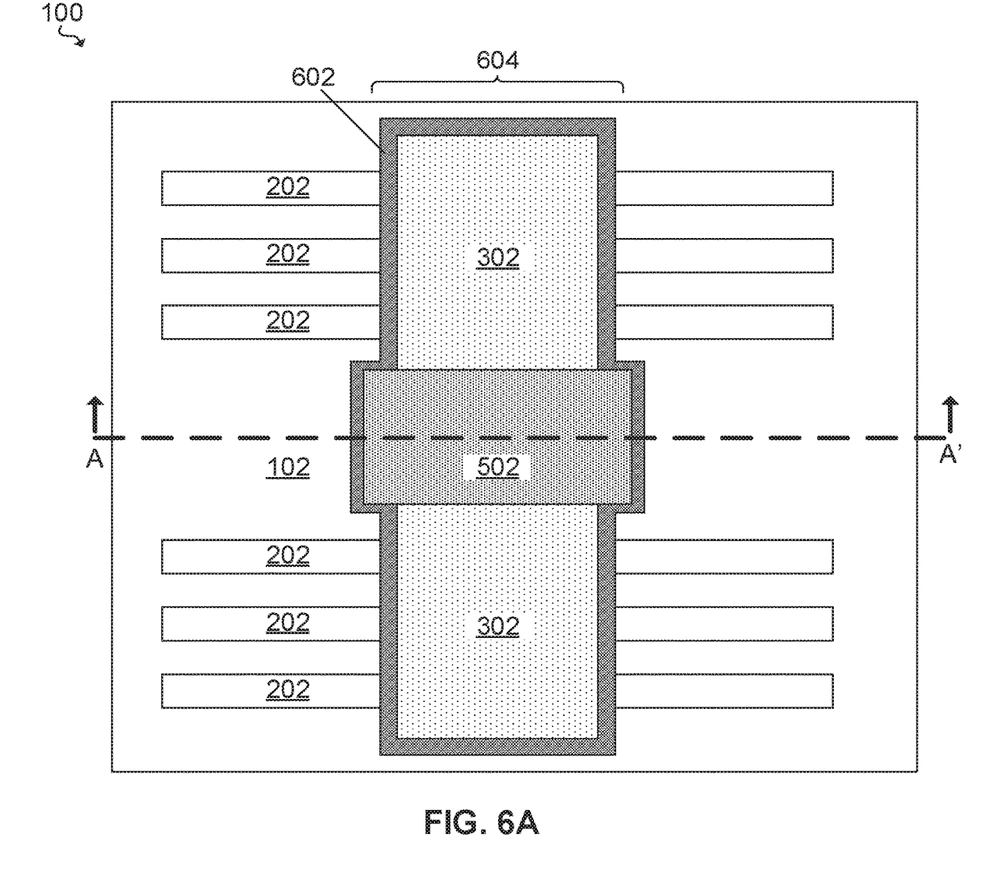
FIG. 6A is a top view and FIG. 6B is a cross section view, both illustrating removing a portion of the dummy gate layer to form a dummy gate, according an embodiment of the present invention.
Figure 6B:
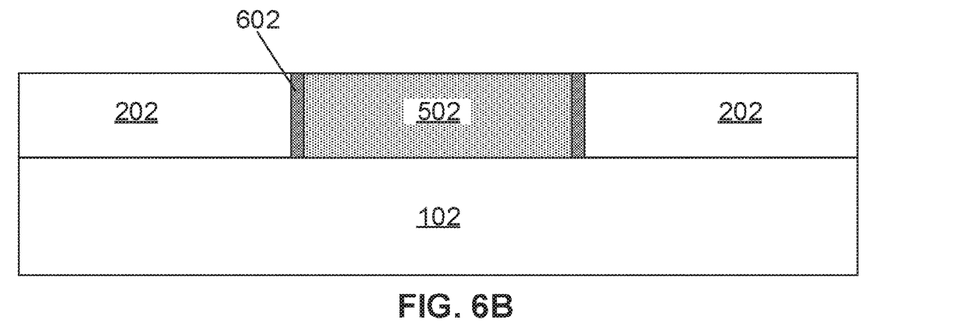

Referring now to FIG. 6A and FIG. 6B, a top view and a cross section view along section line A-A', respectively, illustrating removing a portion of the dummy gate layer 302 to form a dummy gate 604 is shown. In an embodiment, the portion of the dummy gate layer 302 may be removed by conventional patterning and etching techniques, such as, for example, RIE. The dummy gate 604 may cover the fins 202 in the first fin group 204, portions of the intermediate region 208 and the fins 202 in the second fin group 206. The dummy gate 604 may have a first portion 606 covering the first fin group 204 and a second portion 608 covering the second fin group 206. The first portion 606 may be separated, and electrically insulated, from the second portion 608 by the dielectric region 502. In an embodiment, a spacer 602 may be formed on outer surfaces of the dummy gate 604 and outer surface of the dielectric region 502. The spacer 602 may be formed using a conventional deposition process, such as, for example, ALD, CVD, LPCVD, PECVD, PVD, MBD, PLD, LSMCD, plating, or sputtering, and may then be etched so that only a portion remains on the outer surfaces of the dummy gate 604 and the dielectric region 502, which may be in a middle portion of the dummy gate 604. In an embodiment, the spacer 602 may be composed of an oxide, a nitride, or an oxynitride.

Figure 7A:
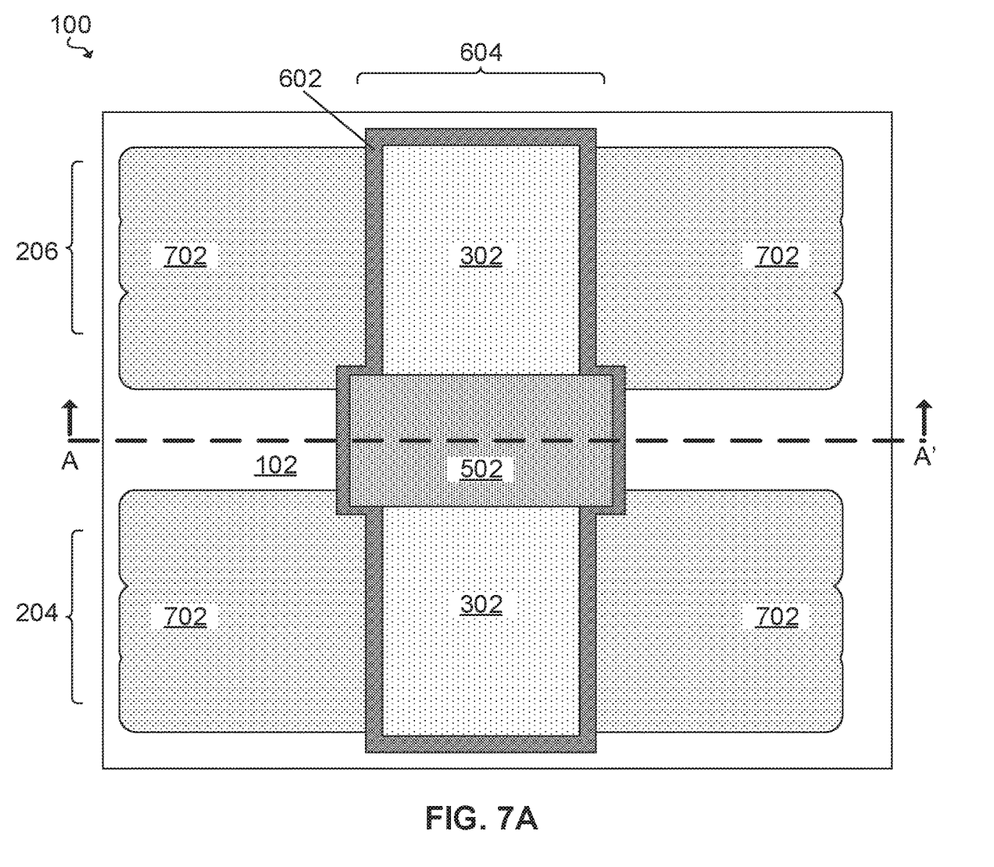
FIG. 7A is a top view and FIG. 7B is a cross section view, both illustrating forming epitaxial regions on the fins, according an embodiment of the present invention.
Figure 7B:
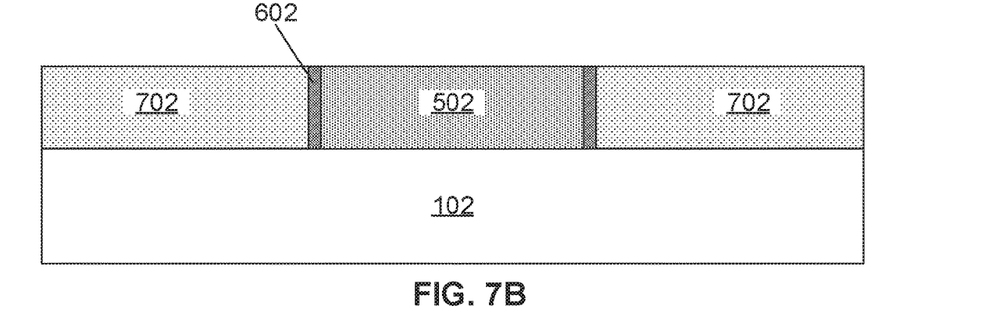

Referring now to FIG. 7A and FIG. 7B, a top view and a cross section view along section line A-A', respectively, illustrating forming epitaxial regions 702 on the fins 202 (FIG. 6A) is shown. The epitaxial regions 702 may serve as source/drain regions for the first fin group 204 and the second fin group 206. The epitaxial regions 702 may be composed of a semiconductor material such as, for example, Si, SiGe, Ge, Si:C, or a III-V compound semiconductor material such as InAs, InGaAs, or InP. In an embodiment in which the epitaxial regions 702 are composed of SiGe, the concentration of germanium may range from approximately 10% to approximately 99%, and preferably may range from approximately 15% to approximately 75%. The epitaxial regions 702 can be doped or undoped.

In an embodiment, the epitaxial growth process may include flowing a gaseous mixture of $GeH_4$ and $SiH_4$ ($SiH_2Cl_2$) in an ambient hydrogen environment at a temperature ranging from approximately 500° C. to approximately 900° C., and under a pressure ranging from approximately 0.1 torr to approximately 100 torr. The epitaxial regions 702 may be in-situ doped, or implanted, with either a n-type or a p-type dopant. In an embodiment, the epitaxial regions 702 on the first fin group 204 may be separated into a source region having a first conductivity type on one side of the dummy gate 604 and the dielectric region 502 and a drain region having a second conductivity type on the opposite side of the dummy gate 604. Likewise, the epitaxial regions 702 on the second fin group 206 may be separated into a source region having a first conductivity type on one side of the dummy gate 604 and the dielectric region 502 and a drain region having a second conductivity type on the opposite side of the dummy gate 604.

Figure 8A:
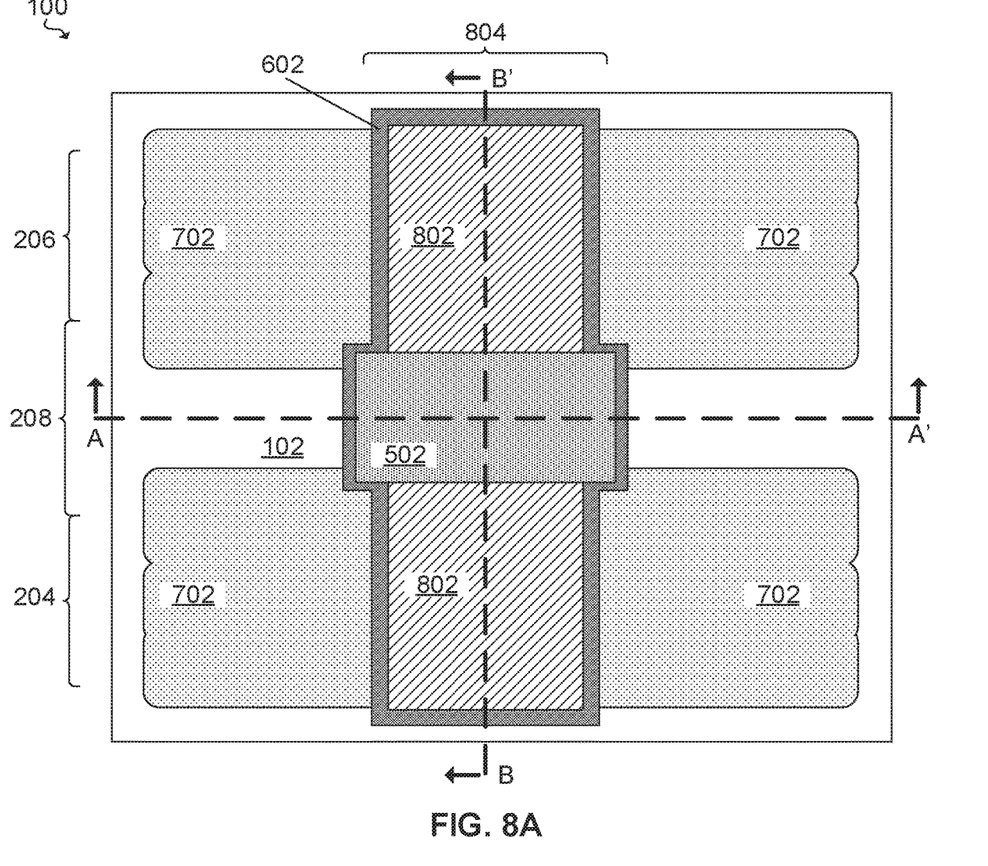
FIG. 8A is a top view and FIG. 8B is a cross section view, both illustrating replacing the dummy gate with a gate to form a gate structure, according an embodiment of the present invention.
Figure 8B:
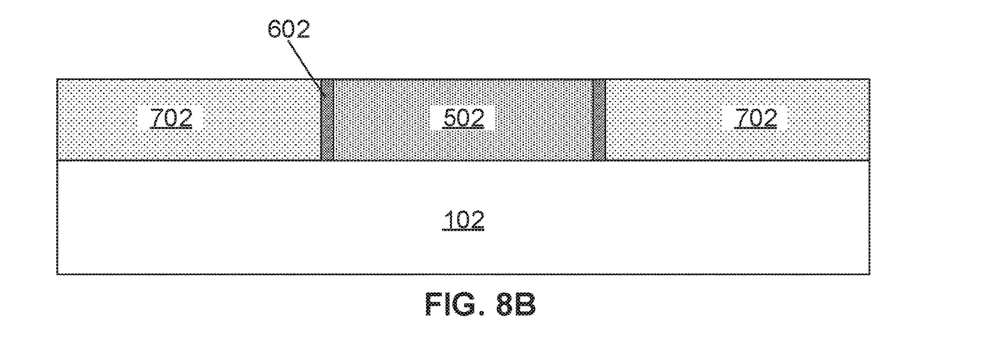

Referring now to FIG. 8A and FIG. 8B, a top view and a cross section view along section line A-A', respectively, illustrating replacing the dummy gate 604 (FIG. 7A) with a gate 802 to form a gate structure 804 is shown. In an embodiment, the dummy gate 604 may be removed selective to the spacer 602, the fins 202 (FIG. 6A), the substrate 102, and the epitaxial regions 702 using a selective etching process, such as, for example a wet etch or RIE. After the dummy gate 604 is removed to create a recess (not shown), the gate 802 may be formed by depositing a conductive material in the recess. The gate 802 may be composed of one or more layers of conductive materials which may include, for example, polycrystalline silicon, or a conductive metal such as copper, tungsten, gold, aluminum, ruthenium, titanium, platinum, or alloys thereof. After the conductive material is deposited, a conventional planarization process, such as, for example, CMP, may be performed such that an upper surface of the 802 is substantially flush with an upper surface of the spacer 602. Because of the location of the spacer 602 and the dielectric region 502 in a middle portion of the gate structure 804, and their insulating properties, the epitaxial regions 702 may remain physically and electrically separated in the intermediate region 208, preventing source-drain shorting in the first fin group 204 and the second fin group 206.

Figure 9:
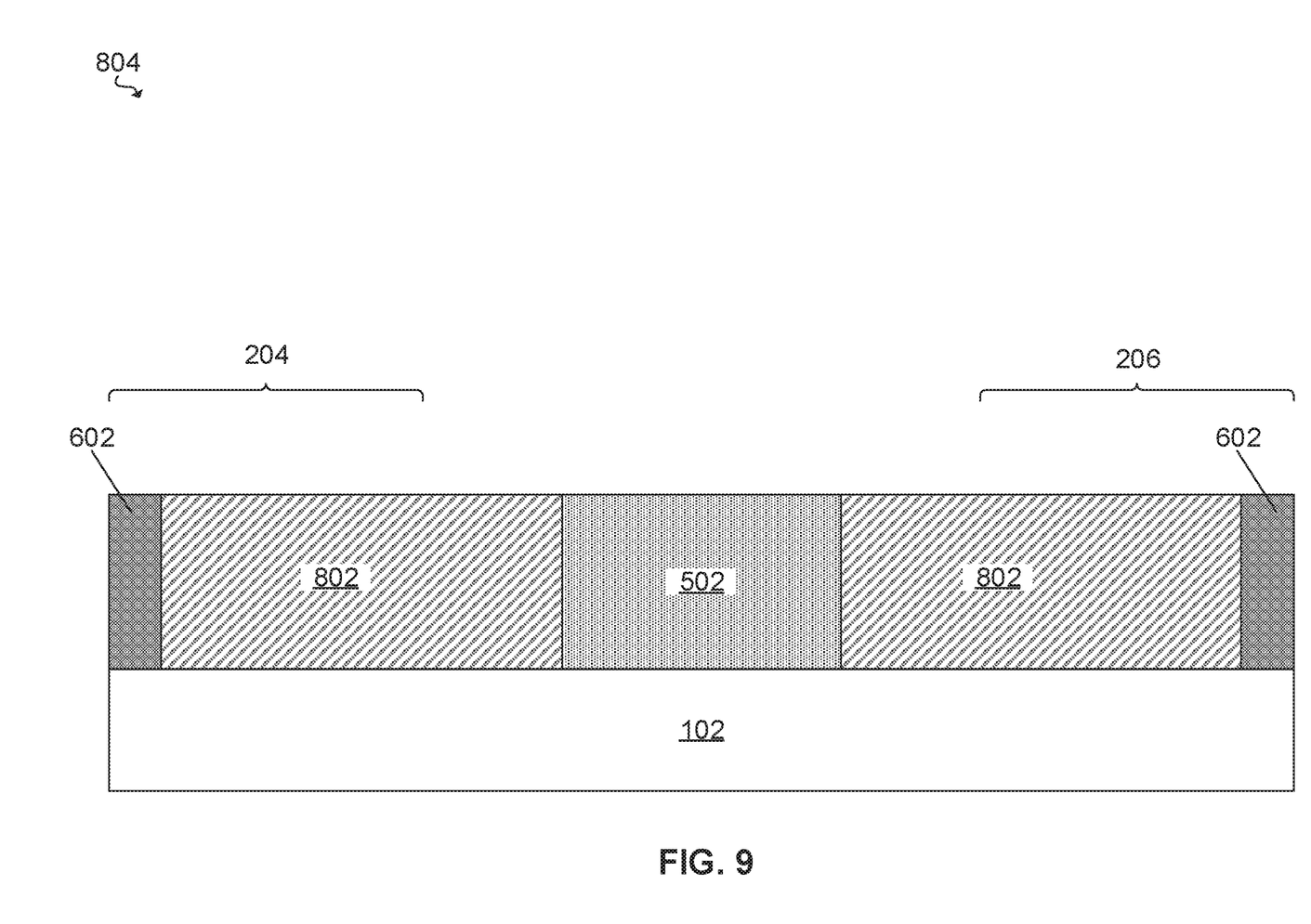
FIG. 9 is a cross section view illustrating the gate structure, according an embodiment of the present invention.

Referring now to FIG. 9, a cross section view along section line B-B' (FIG. 8A) illustrating the gate structure 804 is shown. The gate structure 804 may include two portions of the gate 802 separated in the middle by the dielectric region 502. Because of the location of the dielectric region 502, and its insulating properties, the gate 802 formed on the first fin group 204 may be physically and electrically separated from the gate 802 formed on the second fin group 206. This may allow for the formation of 2 adjacent devices using one fabrication process, and may prevent shorting between the adjacent devices during operation.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
   a first gate separated from a second gate by a dielectric region;
   a first semiconductor fin associated with the first gate;
   a second semiconductor fin associated with the second gate; and
   a continuous spacer surrounding the first gate, the second gate, and the dielectric region, the continuous spacer directly contacting vertical sidewalls of each of the first gate, the second gate, and the dielectric region.

2. The structure of claim 1, wherein the dielectric region comprises an oxide, a nitride, or an oxynitride.

3. The structure of claim 1, wherein at least one of the first gate or the second gate comprises copper, tungsten, gold, aluminum, ruthenium, titanium, platinum, or alloys thereof.

4. The structure of claim 1, wherein at least one of the first gate or the second gate comprises polycrystalline silicon.

5. The structure of claim 1, wherein a dimension of the first gate is less than a dimension of the dielectric region, and a dimension of the second gate is less than the dimension of the dielectric region.

6. The structure of claim 1, further comprising:
   a first epitaxial region on an exposed portion of the first semiconductor fin associated with the first gate; and
   a second epitaxial region on an exposed portion of the second semiconductor fin associated with the second gate, wherein the dielectric region isolates the first epitaxial region from the second epitaxial region.

7. The structure of claim 1, wherein the first semiconductor fin is part of a first fin group and the second semiconductor fin is part of a second fin group.

8. A structure comprising:
   a first metal gate perpendicular to and covering a portion of a first set of fins;
   a second metal gate perpendicular to and covering a portion of a second set of fins;
   a dielectric region separating the first metal gate from the second metal gate, wherein the dielectric region separates a first source/drain region on the first set of fins and a second source/drain region on the second set of fins; and
   a continuous spacer surrounding the first metal gate, the second metal gate, and the dielectric region, the continuous spacer directly contacting vertical sidewalls of each of the first metal gate, the second metal gate, and the dielectric region.

9. The structure of claim 8, wherein the dielectric region comprises an oxide, a nitride, or an oxynitride.

10. The structure of claim 8, wherein at least one of the first metal gate or the second metal gate comprises copper, tungsten, gold, aluminum, ruthenium, titanium, platinum, or alloys thereof.

11. The structure of claim 8, wherein at least one of the first metal gate or the second metal gate comprises polycrystalline silicon.

12. The structure of claim 8, wherein a dimension of the first metal gate is less than a dimension of the dielectric region, and a dimension of the second metal gate is less than the dimension of the dielectric region.

13. The structure of claim 8, further comprising:
   a first epitaxial region on an exposed portion of a first semiconductor fin associated with the first metal gate; and
   a second epitaxial region on an exposed portion of a second semiconductor fin associated with the second metal gate, wherein the dielectric region isolates the first epitaxial region from the second epitaxial region.

14. A structure comprising:
   a gate structure on a portion of a first fin group and a portion of a second fin group, the gate structure comprising a first gate and a second gate, the first fin group being separate from the second fin group by an intermediate region; and
   a dielectric region in the intermediate region separating the first gate from the second gate, the dielectric region separating one or more first epitaxial regions on the first fin group from one or more second epitaxial regions on the second fin group,
   the gate structure comprising a continuous spacer surrounding the first gate, the second gate, and the dielectric region, the continuous spacer directly contacting vertical sidewalls of each of the first gate, the second gate, and the dielectric region.

15. The structure of claim 14, wherein the dielectric region comprises an oxide, a nitride, or an oxynitride.

16. The structure of claim 14, wherein at least one of the first gate or the second gate comprises copper, tungsten, gold, aluminum, ruthenium, titanium, platinum, or alloys thereof.

17. The structure of claim 14, wherein at least one of the first gate or the second gate comprises polycrystalline silicon.

18. The structure of claim 14, wherein a dimension of the first gate is less than a dimension of the dielectric region, and a dimension of the second gate is less than the dimension of the dielectric region.

19. The structure of claim 14, wherein the dielectric region is above and directly contacts a semiconductor substrate.

20. The structure of claim 14, further comprising:
   a first epitaxial region on an exposed portion of a first semiconductor fin associated with the first gate; and
   a second epitaxial region on an exposed portion of a second semiconductor fin associated with the second gate, wherein the dielectric region isolates the first epitaxial region from the second epitaxial region.

* * * * *